United States Patent
Brocato et al.

(10) Patent No.: US 10,243,324 B2
(45) Date of Patent: Mar. 26, 2019

(54) MATCHING DRIVE DEVICE FOR MULTI-BEAM OPTOELECTRONIC ARRAYS

(71) Applicant: TRILUMINA CORP., Albuquerque, NM (US)

(72) Inventors: Robert W. Brocato, Albuquerque, NM (US); Marcelino Armendariz, Albuquerque, NM (US)

(73) Assignee: TRILUMINA CORP., Albuquerque, NM (US)

( * ) Notice: Subject to any disclaimer, the term of this patent is extended or adjusted under 35 U.S.C. 154(b) by 0 days.

(21) Appl. No.: 15/785,312

(22) Filed: Oct. 16, 2017

(65) Prior Publication Data

US 2018/0109071 A1   Apr. 19, 2018

Related U.S. Application Data

(60) Provisional application No. 62/409,144, filed on Oct. 17, 2016.

(51) Int. Cl.
*H01S 5/026*   (2006.01)
*H01S 5/42*    (2006.01)
(Continued)

(52) U.S. Cl.
CPC .............. *H01S 5/0261* (2013.01); *H01P 5/00* (2013.01); *H01S 5/02276* (2013.01);
(Continued)

(58) Field of Classification Search
CPC . H01S 5/183; H01S 5/423; H01S 5/42; H01S 5/0226; H01S 5/0261; H01S 5/0427; H01P 5/12; G02B 6/4219; H01L 23/5384
See application file for complete search history.

(56) References Cited

U.S. PATENT DOCUMENTS 6,608,535 B2 *  8/2003  Sherman ................ H01P 5/16
                                                333/128
6,862,310 B2    3/2005  Di Sopra et al.
(Continued)

OTHER PUBLICATIONS

Baker-Jarvis et al, "NIST Technical Note 1520: Dielectric and Conductor-Loss Characterization and Measurements on Electronic Packaging Materials," Jul. 2001, NIST technical Note 1520, p. 113.*
(Continued)

*Primary Examiner* — Michael Carter
(74) *Attorney, Agent, or Firm* — BakerHostetler

(57) ABSTRACT

An apparatus providing a phase-matched interface between a driver device and a multibeam optoelectronic device, such as a VCSEL array device, is disclosed as well as various methods for utilization and manufacturing of the same. The interface device includes an input adapted to interface with the driver device, an output to interface with the multibeam optoelectronic device, and a power splitter to electrically connect the output to the input. The output includes a plurality of output contacts that each interface with one optoelectronic device among the plurality of optoelectronic devices of the multibeam optoelectronic device via one transmission line among a plurality of transmission lines having a common electrical length. In embodiments, the power splitter is a resistor-based power splitter that adjusts an overall impedance of the power splitter at each "tee" junction or intersection to provide an impedance-matched interface.

22 Claims, 14 Drawing Sheets

(51) Int. Cl.
*H01P 5/00* (2006.01)
*H01S 5/022* (2006.01)
*H01S 5/042* (2006.01)
*H01S 5/00* (2006.01)
*H01S 5/062* (2006.01)

(52) U.S. Cl.
CPC .............. *H01S 5/423* (2013.01); *H01S 5/426* (2013.01); *H01S 5/005* (2013.01); *H01S 5/02252* (2013.01); *H01S 5/0427* (2013.01); *H01S 5/06226* (2013.01)

(56) References Cited

U.S. PATENT DOCUMENTS

| | | | |
|---|---|---|---|
| 7,013,088 | B1 | 3/2006 | Jiang et al. |
| 7,324,060 | B2 * | 1/2008 | Quan ........................ H01P 5/16 333/125 |
| 7,447,534 | B1 | 11/2008 | Kingsley et al. |
| 7,949,024 | B2 | 5/2011 | Joseph |
| 8,233,805 | B2 | 7/2012 | Tatum et al. |
| 8,848,757 | B2 | 9/2014 | Joseph |
| 2007/0217175 | A1 * | 9/2007 | Young ..................... H01L 23/66 361/782 |
| 2014/0049862 | A1 * | 2/2014 | Ma ......................... H01L 23/60 361/56 |
| 2016/0141742 | A1 | 5/2016 | Xue et al. |

OTHER PUBLICATIONS

International Patent Application No. PCT/US2017/056913; Int'l Search Report and the Written Opinion; dated Jan. 4, 2018; 12 pages.

* cited by examiner

MATCHING DRIVE DEVICE FOR MULTI-BEAM OPTOELECTRONIC ARRAYS

CROSS REFERENCE TO RELATED APPLICATIONS

This application claims benefit under 35 U.S.C. § 119(e) of Provisional U.S. Patent Application No. 62/409,144, filed Oct. 17, 2016, the contents of which is incorporated herein by reference in its entirety.

TECHNICAL FIELD

The present disclosure relates generally to semiconductor devices and, more particularly, to interface devices for matching a phase and/or impedance of a driver device output to inputs of optoelectronic devices forming multi-beam arrays in high power and high frequency applications, and methods of making and using the same.

BACKGROUND INFORMATION

Semiconductor optoelectronic devices, such as lasers, can be used for free space communications and other applications by modulating an optical output (e.g., laser beam) at the transmitter and detecting the modulation at the receiver. Such optoelectronic devices include vertical-cavity surface-emitting lasers (VCSELs), which are particularly well suited for free space communications and other applications. VCSELs are well suited for free space communications and other applications because the entire laser can be switched on and off very rapidly, without the need for an external optical shutter, simply by modulating the bias power to the VCSEL. However, individual VCSELs have a limited range over which they can be used to communicate, since one high speed VCSEL by itself is typically not able to produce more than a few milliwatts of optical power. One way to overcome the limited range of individual VCSELs is to use an array of VCSELs when communicating over longer distances. To effectively communicate with an array of VCSELs, all of the individual VCSELs of the array should be operated at full power and with coherent phase. In order to make all of the lasers in a VCSEL array operate coherently and at full power, a phase-balanced, impedance-matched driver may be needed to drive each individual VCSEL of the VCSEL array.

SUMMARY

An embodiment is directed to an interface device for providing a phase-matched interface between a driver device and a multibeam optoelectronic device, such as a VCSEL array device, as well as various methods for utilization and manufacturing of the same. The input device includes an input adapted to interface with the driver device; an output to interface with the multibeam optoelectronic device; and a power splitter to electrically connect the output to the input. The output includes a plurality of output contacts that each interface with one optoelectronic device among the plurality of optoelectronic devices of the multibeam optoelectronic device via one transmission line among a plurality of transmission lines having a common electrical length. In an embodiment, the power splitter is a resistor-based power splitter that adjusts an overall impedance of the power splitter at each "tee" junction or intersection to provide an impedance-matched interface.

These and other features will be more clearly understood from the following detailed description taken in conjunction with the accompanying drawings and claims. This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION OF EMBODIMENTS

The present disclosure describes particular embodiments and their detailed construction and operation. The embodiments described herein are set forth by way of illustration only and not limitation. Those skilled in the art will recognize, in light of the teachings herein, that there may be a range of equivalents to the exemplary embodiments described herein. Most notably, other embodiments are possible, variations can be made to the embodiments described herein, and there may be equivalents to the components, parts, or steps that make up the described embodiments. For the sake of clarity and conciseness, certain aspects of components or steps of certain embodiments are presented without undue detail where such detail would be apparent to those skilled in the art in light of the teachings herein and/or where such detail would obfuscate an understanding of more pertinent aspects of the embodiments.

Disclosed herein is an interface device for providing a phase-matched and/or impedance-matched interface between a driver device and an optoelectronic array device in order to enable each optoelectronic devices in the optoelectronic array device operate coherently and at full power. Some embodiments of the present invention are described herein in terms of a VCSEL for illustrative purposes. However, embodiments of the present invention are not limited to a VCSEL, but rather may include any type of optoelectronic device or combination of optoelectronic device types that provide similar functionality as a VCSEL. For example, such optoelectronic devices may include light emitting diodes, photodetectors, edge-emitting lasers, modulators, high electron mobility transistors, resonant tunneling diodes, heterojunction bipolar transistors, quantum dot lasers and the like. Such VCSEL array devices and methods for manufacturing them are known. See, for example, commonly owned U.S. patent application Ser. No. 13/077,769, filed Mar. 31, 2011 and entitled "Multibeam Arrays of Optoelectronic Devices for High Frequency Operation," which is incorporated herein by reference.

As used herein, "circuit" describes one or more components that are coupled together to provide a defined function or functions. The one or more components selected to implement the disclosed optoelectronic driver device may include active components, passive components, or a combination thereof depending on the particular application and according to well-known design rules. In operation, the disclosed driver circuit provides a drive signal to electrically drive the individual VCSELs (or other optoelectronic devices) forming the VCSEL array device from a common drive point. The drive signal provided by the disclosed driver circuit may be impedance-matched, phase-balanced, or a combination thereof.

Figure 1:
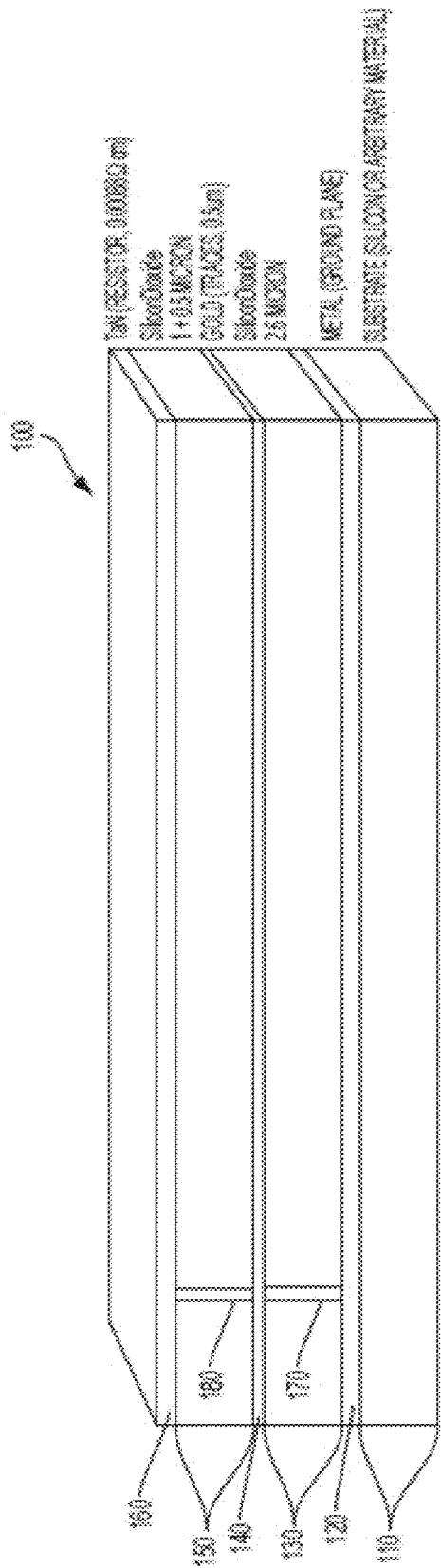
FIG. 1 depicts a cross-sectional, perspective view illustrating a substrate stack for implementing an interface to a semiconductor or optoelectronic device or array of devices, in accordance with an embodiment of the present disclosure.

Turning to FIG. 1, a cross-sectional view of a substrate stack 100 is depicted for implementing an interface device in accordance with an embodiment of the present disclosure. In an embodiment, the semiconductor device is comprised of an optoelectronic driver device, an optoelectronic device array, an interface device, or any combination thereof. As depicted in FIG. 1, substrate stack 100 includes substrate 110, ground plane 120, first dielectric layer 130, and conductor layer 140. Some embodiments may include an additional dielectric layer 150 and a layer for fabricating resistors, layer 160. Substrate 110 provides a support layer for a semiconductor device implemented with substrate stack 100. In the embodiment, substrate 110 is depicted as being composed of silicon (Si). However, those skilled in the art will recognize that other materials may similarly be used for the support layer. For example, substrate 110 may be comprised of aluminum oxide, aluminum nitride, silicon carbide or other common ceramic materials. It may also be a composite material, like FR-4 or polyimide as used in printed circuit boards. It may also be a metallic structure. It will likewise be recognized that such factors as layer thickness may vary based on design choice, application-specific factors, and the like.

Ground plane 120 may be composed of any metal or other conductive material formed on substrate 110 using any known deposition method. Such deposition methods include: evaporation, electrolytic plating, electroless plating, or screen printing process. Some examples of conductive materials comprising ground plane 120 include: aluminum (Al), an Al alloy, copper (Cu), or a Cu alloy. In operation, ground plane 120 may isolate higher frequency signals propagating through the interface device from substrate 110. By isolating the higher frequency signals from substrate 110, ground plane 120 may improve signal strengths received by an optoelectronic device being driven by such higher frequency signals. In an embodiment, ground plane 120 may improve such received signal strengths by reducing dielectric absorption losses otherwise experienced by the high frequency signals due to interactions between the higher frequency signals and substrate 110.

Substrate stack 100 further includes first dielectric layer 130 composed of dielectric material and formed on ground plane 120. In the depicted embodiment, first dielectric layer 130 is composed of a 2.6 micron thick layer of silicon dioxide (SiO2). However, first dielectric layer 130 may be composed of any dielectric material known to those skilled in the art as having a low dielectric loss tangent value or dissipation factor. For example, first dielectric layer 130 may be composed of any known dielectric material with a dielectric loss tangent value equal to or lower than 0.01 at 1 gigahertz (GHz). In operation, first dielectric layer 130 is formed as a very thin layer of dielectric material that enables the creation of very narrow transmission lines for the semiconductor device. In an embodiment, the width of such transmission lines created for the semiconductor device is proportional to a thickness of first dielectric layer 130.

At least one opening is etched into first dielectric layer 130 and subsequently filled with a conductive material (e.g., metal) to form conductive via 170. In an embodiment, the at least one opening etched into first dielectric layer 130 is filled with a conductive material when conductor layer 140 is deposited. In an embodiment, the at least one opening etched into first dielectric layer 130 is filled with a conductive material separate from the deposition of conductor plane 140. Conductive via 170 is used to electrically couple ground plane 120 with structures fabricated in conductor layer 140.

Transmission lines for semiconductor devices implemented with substrate stack 100 may be formed in conductor layer 140 that is deposited on first dielectric layer 130. In an embodiment, such transmission lines created for the semiconductor device may have a substantially constant impedance value. In the depicted embodiment, conductor layer 140 is composed of a 0.5 micrometer (μm) thick layer of gold (Au). However, conductor layer 140 may similarly be composed of any conductive material known by those skilled in the art that is appropriate for implementing conductive paths in high frequency applications.

Conductive layer 140 also provides a surface for bonding the optoelectronic devices or array of optoelectronic devices. This bonding process is often referred to as flip-chip bonding and the bonding process may use solders, conductive adhesives or other means to make contact between the optoelectronic devices and conductive layer 140. Conductive layer 140 may be commonly patterned by processes known to those skilled in the art to create transmission lines and bond pads for attachment of the optoelectronic devices.

In embodiments where semiconductor devices implemented with substrate stack 100 include resistive elements (e.g., resistors), substrate stack 100 may further include second dielectric layer 150 and resistive layer 160. As depicted in FIG. 1, resistive layer 160 may be formed on a second dielectric layer 150 deposited on conductor layer 140. In the depicted embodiment, resistive layer 160 is implemented as a layer of tantalum nitride (TaN) deposited on a layer of SiO2 that forms second dielectric layer 150. However, resistive layer 160 may similarly be implemented as a layer of any known resistive material, such as nichrome (NiCr).

Second dielectric layer 150 may be patterned to allow for contact to the conductor layer 140 in locations that may allow the contact of the optoelectronic devices to pads in conductive layer 140 and for resistive layer 160 to make contact to conductor layer 140 where resistors are to be fabricated. Conductor layer 140 and resistive layer 160 may each be patterned by processes known to those skilled in the art to form discrete resistors. Similarly, second dielectric layer 150 may be implemented using any known dielectric material. When implemented, at least one opening is etched into second dielectric layer 150 and subsequently filled with a conductive material (e.g., metal) to form conductive via 180. Conductive via 180 is used to electrically couple resistive layer 160 with structures fabricated in conductor layer 140.

As mentioned above, in embodiments substrate stack 100 may be used to implement an interface device for an optoelectronic device or array of such devices that may be bonded to a surface of substrate stack 100. In an embodiment, bonding the interface device implemented by substrate stack 100 to the optoelectronic device(s) may require the interface device providing a plurality of contact points that are substantially in the same plane for sufficient bonding contact. Upon bonding the interface device to the optoelectronic device(s), the interlayer connections within substrate stack 100 provided by conductive via 170 (and conductive via 180 when implemented) enable anode and cathode contacts to be made using features patterned in conductor layer 140.

Figure 2:
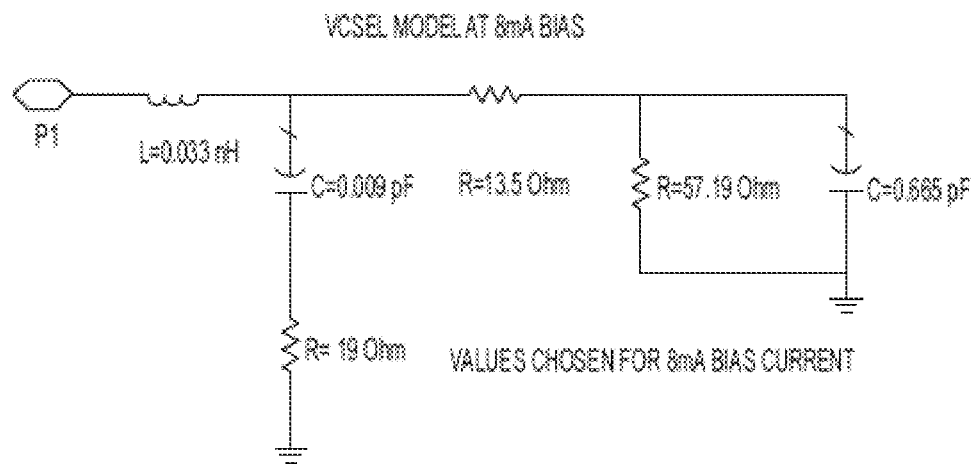
FIG. 2 depicts an equivalent circuit model for an example VCSEL, in accordance with an embodiment of the present disclosure.
Figure 3:
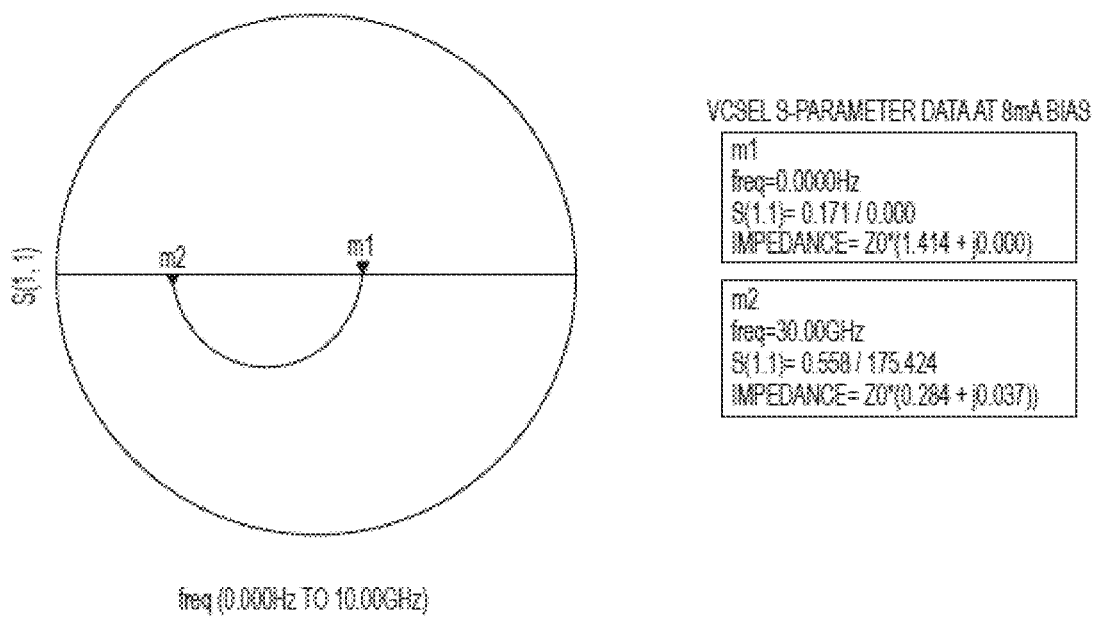
FIG. 3 shows s-parameter data determined for the equivalent circuit model of the example VCSEL depicted in FIG. 2, in accordance with an embodiment of the present disclosure.
Figure 4:
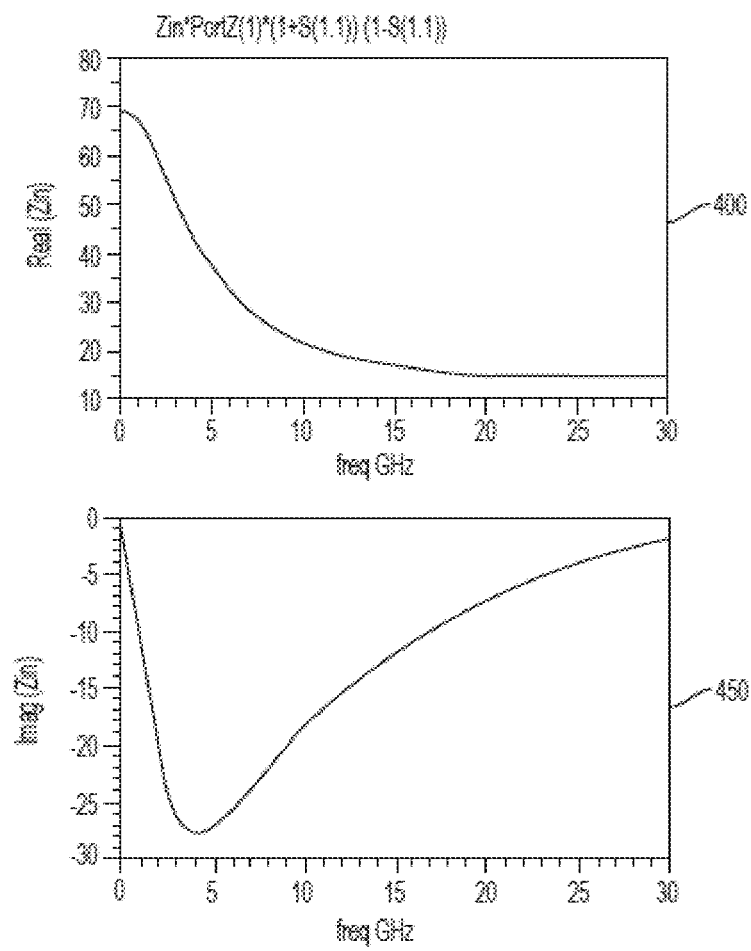
FIG. 4 shows input impedance data for the equivalent circuit model of the example VCSEL depicted in FIG. 2, in accordance with an embodiment of the present disclosure.

The interface device may provide an impedance-matched and/or phase-matched interface between a device driver and optoelectronic array device. For example, the interface device may provide an impedance-matched and/or phase-matched interface between a device driver and an optoelectronic array device comprising a plurality of VCSELs. In an embodiment, each VCSEL of the plurality of VCSELs may be represented by the equivalent circuit model depicted in FIG. 2. Each of the values for the electronic components included in the equivalent circuit model depicted by FIG. 2 were chosen to represent a VCSEL that is supplied with an 8 milliamp (mA) bias current. FIGS. 3-4 show various parameters of the equivalent circuit model of the example VCSEL depicted by FIG. 2. In FIG. 3, a Smith Chart shows data for the $S_{11}$ scattering parameter (s-parameter) determined for the equivalent circuit model of the example VCSEL depicted in FIG. 2. In FIG. 4, chart 400 shows the real component of input impedance determined and chart 450 shows the imaginary component of input impedance determined for the equivalent circuit model of the example VCSEL depicted in FIG. 2.

Interface devices in accordance with embodiments of the present disclosure are adapted to match an output impedance of a driver device to an input impedance of each optoelectronic device among a plurality of optoelectronic devices forming an optoelectronic array device. For example, such interface devices are adapted to match an output impedance of a driver device to an input impedance of each VCSEL, as represented by the equivalent circuit model depicted in FIG. 2, among a plurality of VCSELs. By matching the output impedance of the driver device to the input impedance of each optoelectronic device, electrical reflections on intervening transmission lines may be reduced. In addition, the power transferred between the driver device and each optoelectronic device may be increased.

Existing driver devices used to drive optoelectronic devices, such as VCSELs, have a fixed differential output. For example, a MAX3946 differential driver device provided by the MAXIM Integrated Corporation of San Jose, Calif. may have a fixed differential output of 50Ω. However, the input impedance of an optoelectronic device may vary with frequency, as shown by charts 400 and 450 of FIG. 4. Accordingly, an interface device is needed to provide an impedance-matched interface between a driver device with a fixed differential output and an input impedance of each optoelectronic device in an optoelectronic array device that varies with frequency.

In an embodiment, when impedance values for both the driver device output and each optoelectronic device input are primarily resistive, such an impedance-match interface may be implemented by providing an interface device composed of transmission lines having appropriate impedance values. For example, appropriate impedance values may be determined by taking the square root of the product of the driver device output impedance and optoelectronic device input impedance, since only the real component of impedance is present in primarily resistive impedances. An interface device implemented in accordance with this embodiment may be considered very broadband, as its primarily resistive impedance values will not vary with frequency. In systems operating in broadband frequency ranges; however, the impedance values for both the driver device output and each optoelectronic device input will also include strong reactive components of impedance. Accordingly, a different interface device may be needed for systems operating in broadband frequency ranges.

In an embodiment, an interface device for systems operating in broadband frequency ranges may include a resistor-based power splitter. In this embodiment, resistance values associated with one or more branches (or transmission paths) of the resistor-based power splitter may be determined based on tradeoffs between two or more factors. For example, resistance values associated with one or more branches may be determined based on tradeoffs between impedance matching among respective branches and resistive voltage drops in the one or more branches due to bias current. As used herein, "resistor-based power splitter" refers to a broadband microwave circuit used to divide power from a single input between two or more outputs. In an embodiment, multiple resistor-based power splitters may be connected in stages or series to provide additional power splitting between three or more outputs.

Figure 5:
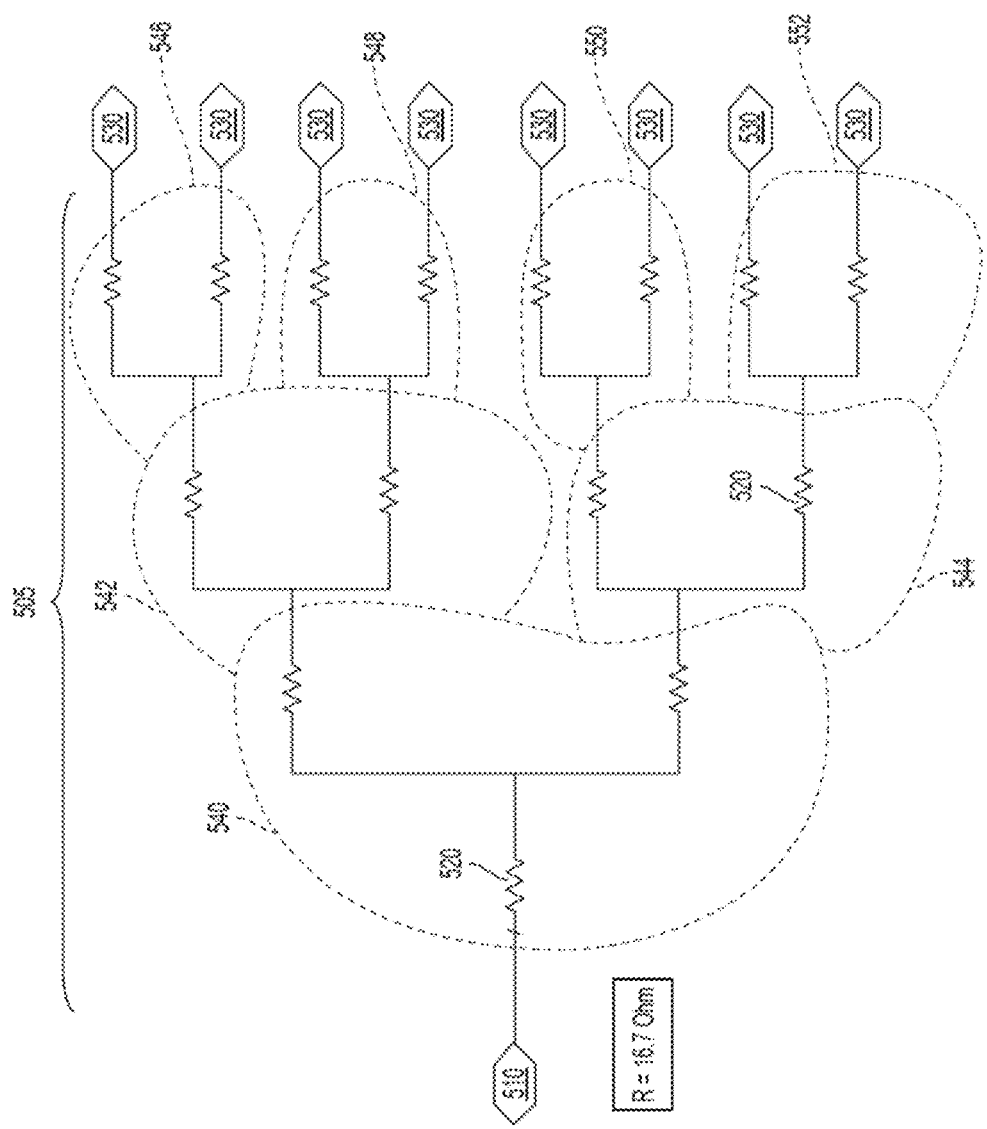
FIG. 5 is a schematic diagram depicting an interface device that includes a resistor-based power splitter, in accordance with an embodiment of the present disclosure.

FIG. 5 is a schematic diagram depicting an example of an interface device 500 that includes a resistor-based power splitter (i.e., eight-way resistor-based power splitter 505), in accordance with an embodiment of the present disclosure. As depicted in FIG. 5, interface 500 includes input 510, resistors 520, and output contacts 530. In an embodiment, eight-way resistor-based power splitter 505 includes resistor-based power splitters 540-552, which are represented in FIG. 5 by the sub-portions of eight-way resistor-based power splitter 505. As known by those skilled in the art, one or more of resistors 520 may be implemented with any number of physical resistors. As such, resistors 520 represent a resistive value associated with a corresponding segment of eight-way resistor-based power splitter 505. In an embodiment, every resistor among resistors 520 may have an equivalent resistive value. In this embodiment, the equivalent resistive value (R) is determined by:

Equation 1

$$R = Z_o\left(\frac{N-1}{N+1}\right) \quad (1)$$

Where:

$Z_o$=a characteristic impedance of a transmission line, such as 50Ω

N=a number of output contacts included in a resistor-based power splitter

For example, a two-way resistor-based power splitter, such as any of resistor-based power splitters 540-552, may use up to three resistors. Assuming a characteristic impedance of 50Ω for the transmission line in this example, each of the three resistors may have a resistive value of 16.67Ω (50Ω/3). As discussed above, eight-way resistor-based power splitter 505 includes resistor-based power splitters 540-552. As such, eight-way resistor-based power splitter 505 uses a series of three layers of two-way resistor-based power splitters to divide power received at input 510 between eight output contacts 520. Each of these two-way resistor-based power splitters comprised of resistors having resistor values of 16.67Ω, according to Equation 1. In contrast, conventional power splitters may be implemented with single eight-way resistor-based power splitters comprising resistors typically having resistors values of around 37.78Ω. As a result of the lower resistive value of resistors 520, eight-way resistor-based power splitter 505 experiences a lower resistive voltage drop due to bias current than conventional power splitters.

In an embodiment, results obtained when using interface device 500 to provide an interface between an optoelectronic array device comprised of plurality of example VCSELs of FIG. 2 and a driver device (providing each VCSEL with 8 mA bias current) are shown below in Table 1.

TABLE 1

| | |
|---|---|
| Power transmission to any output contact | −16.9 dB |
| Input return loss | 16.9 dB |
| Any output contact return loss | 20.7 dB |
| Worst case isolation output contact-to-output contact | −7.8 dB |
| Best case isolation output contact-to-output contact | −24.9 dB |

One advantage of using resistor-based power splitters may be that they are very wideband. They are very wide band because such devices can operate from direct current (DC) up to a maximum frequency that is limited only by a parasitic capacitance of a resistor-based power splitter's structure. Another advantage of resistor-based power splitters may be that they can be implemented as very compact devices. A minimal size limit for such devices may be imposed by the particular semiconductor manufacturing process used to implement the resistor-based power splitter. In contrast, non-resistive power splitters (e.g., Wilkinson and Gysel power splitters) are typically narrowband devices with relatively large physical dimensions that may be difficult to integrate into a micro-sized optoelectronic array device.

A possible disadvantage of including a resistor-based power splitter in an interface device may be a portion of power received at an input may be consumed by resistors in the one or more branches prior to reaching an output. For example, approximately one half of the power received at an input may be consumed by resistors in the one or more branches prior to reaching an output.

Figure 6:
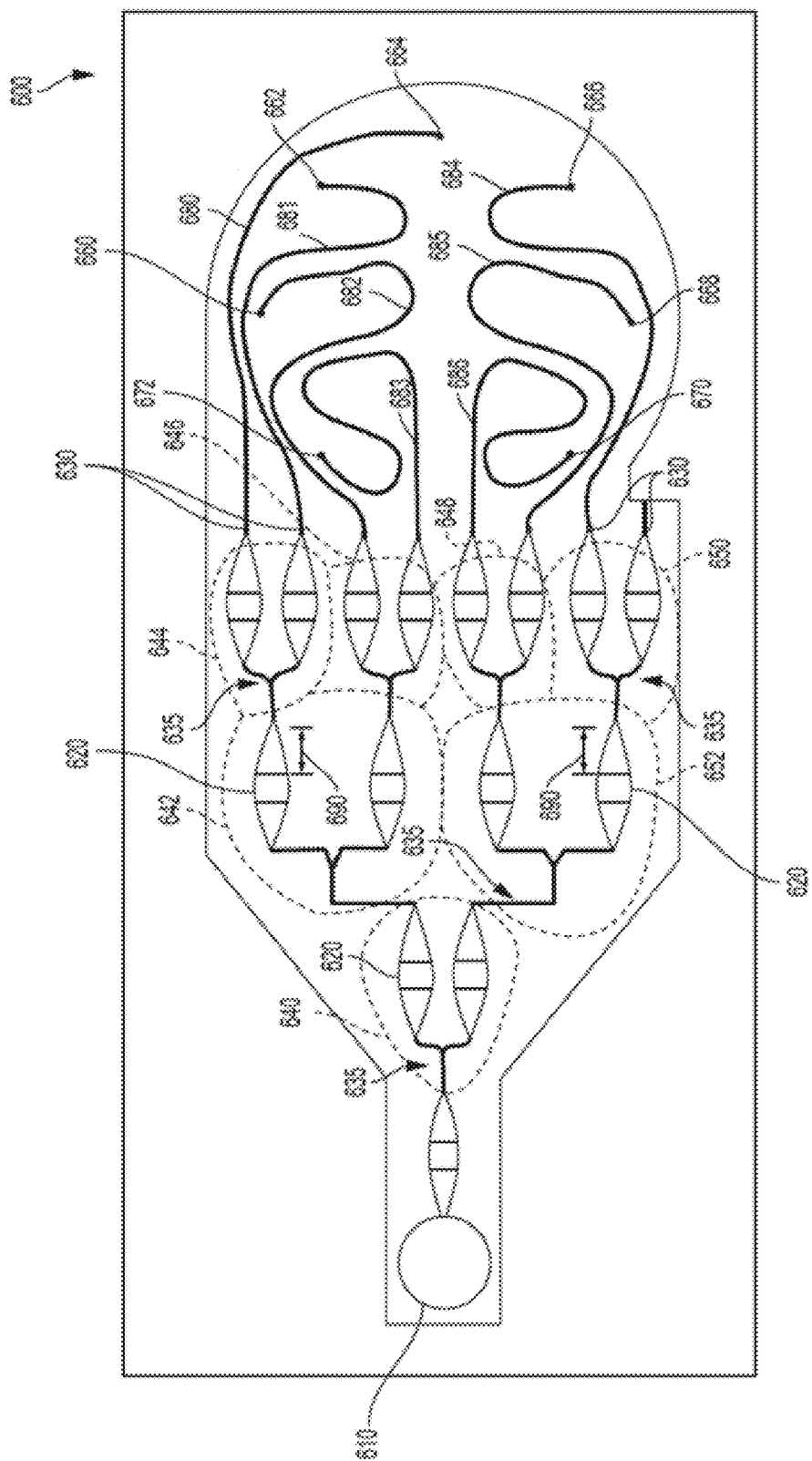
FIG. 6 depicts a top plan view of a structure implementing the interface device of FIG. 5 in accordance with an embodiment of the present disclosure.

FIG. 6 depicts an interface device 600 implementing an embodiment of interface device 500 of FIG. 5, in accordance with the present disclosure. Semiconductor device 600 includes ground contact (cathode) area 605, input 610, resistors 620, output contacts 630, resistor-based power splitters 640-652, and VCSELs 660-672. In an embodiment, VCSELs 660-672 collectively form an optoelectronic array device. Interface device 600 further includes transmission lines 680-686 that electrically connect each output contact among the output contacts 630 to one VCSEL among VCSELs 660-672. In an embodiment, each transmission line among transmission lines 680-686 are arranged on interface device 600 such that each transmission line among transmission lines 680-686 has an equivalent electrical length. That is, an electrical length of transmission line 680 is equivalent to an electrical length of transmission line 683, which is equivalent to an electrical length of 686, and so on.

In an embodiment, each transmission line among transmission lines 635 and 680-686 is formed in a conductor layer of a substrate stack, such as conductor layer 140 of FIG. 1. The ground or cathode contact area 605 is also formed in the same conductive layer as the transmission lines. This conductive pattern is isolated from the transmission lines by the patterning process and is connected to the ground layer (conductor layer 120 in FIG. 1) with vias between the conductive layers (shown as 170 in FIG. 1). As discussed above, a width of each transmission line may be determined based upon a thickness of a dielectric layer (e.g., first dielectric layer 130 of FIG. 1) intervening between the conductor layer and an underlying substrate. For example, if the dielectric layer intervening between the conductor layer and the underlying substrate is 2.6 μm, each transmission line among transmission lines 635 and 680-686 may have a width of 5 μm. Also, in this example, each transmission line among transmission lines 635 and 680-686 may have an impedance value of 50Ω.

In an embodiment, each resistor among resistors 620 may be formed in a resistive layer of a substrate stack, such as resistive layer 160 of FIG. 1. As discussed above, a dielectric layer may intervene between the resistive layer and the conductor layer in the substrate stack. In an example, a resistive layer may be implemented by depositing a layer of resistive material such as TaNi on a dielectric layer. Also, in this example, each resistor among resistors 620 may have a resistive value of 16.7Ω. In an embodiment, each transmission line among transmission lines 635 may taper from a width of 5 μm to a width of 24 μm in a region surrounding each resistor among resistors 620. Although each transmission line may taper from a different initial width to a different resistor-adjacent width depending on such factors as: a thickness of a dielectric layer intervening between a conductor layer and an underlying substrate; a resistive value of a resistor; and the like. This tapering the width of a transmission line from a first value to a second value in a region surrounding a resistor may minimize discontinuities in a signal propagation path, which may cause reflections. In FIG. 6, an example of this region surrounding some resistor among resistors 620 is represented by designator 690. Interface device 600 may provide phase coherent signals at higher data rates than otherwise possible by minimizing discontinuities in the signal propagation path when designing interface device 600.

Figure 7:
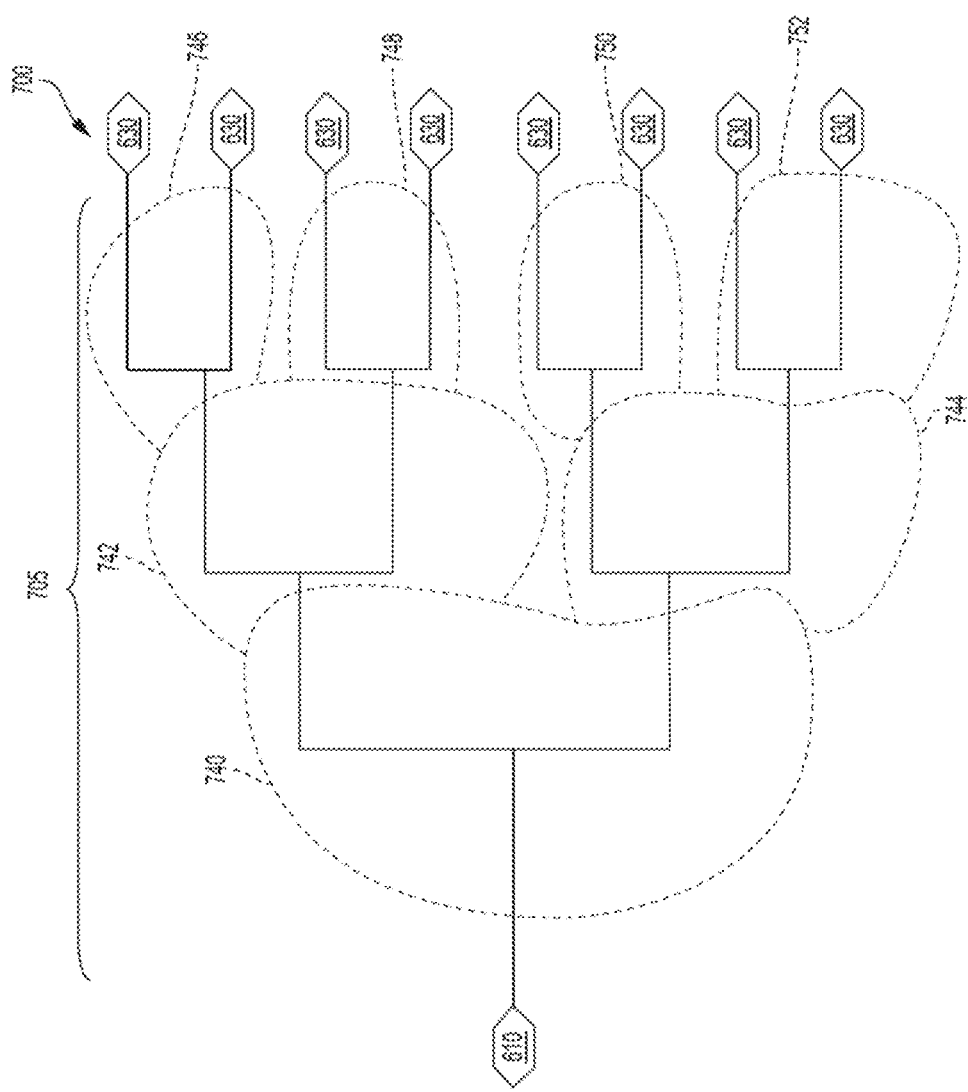
FIG. 7 is a schematic diagram depicting an interface device that includes a resistor-less power splitter, in accordance with an embodiment of the present disclosure.

FIG. 7 is a schematic diagram depicting an example of an interface device 700 that includes a resistor-less power splitter (i.e., eight-way resistor-less power splitter 705), in accordance with an embodiment of the present disclosure. In contrast to interface device 500 of FIG. 5, interface device 700 does not include resistors. Instead, interface device 700 utilizes a plurality of transmission lines 735 having a substantially constant impedance values (e.g., 50Ω) to electrically connect input 610 to output contacts 630. In an embodiment, interface device 700 provides a phase-matched but not an impedance-matched interface between a driver device and an optoelectronic array device. In this embodiment, without resistors, interface device 700 may not be able to adjust the overall impedance at each "tee" junction or intersection to provide an impedance-matched interface. Additionally, interface device 700 may not be able to minimize reflections as interface device 500 did, for example, by tapering each transmission line among transmission lines 635 in a region around resistors. However, interface device 700 may provide an improved power transmission to any output contact since there are no resistors to introduce a resistive voltage drop.

Figure 8:
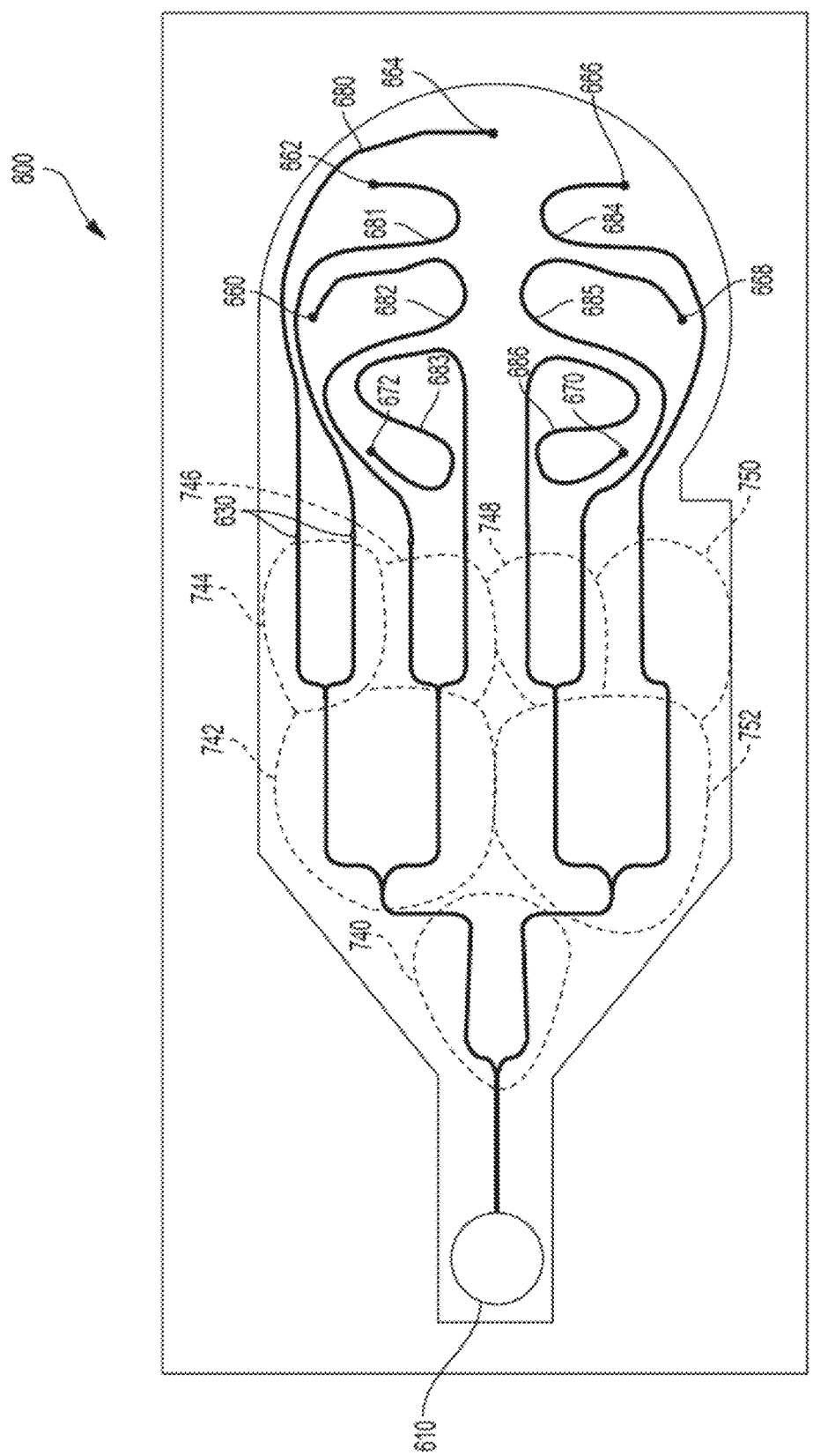
FIG. 8 depicts a top plan view of a structure implementing the interface device of FIG. 7 in accordance with an embodiment of the present disclosure.

FIG. 8 depicts an interface device 800 implementing an embodiment of interface device 700 of FIG. 7, in accordance with the present disclosure. Interface device 800 includes ground contact (cathode) area 605, input 610, output contacts 630, resistor-less power splitters 740-752, VCSELs 660-672, and transmission lines 680-686.

In an embodiment, results obtained when using interface device 700 to provide an interface between an optoelectronic array device comprised of plurality of example VCSELs of FIG. 2 and a drive device (providing each VCSEL with 8 mA bias current) are shown below in Table 2.

TABLE 2

| Power transmission to any output contact | −12.7 dB |
|---|---|
| Input return loss | 4.0 dB |
| Any output contact return loss | 6.0 dB |
| Worst case isolation output contact-to-output contact | −6.0 dB |
| Best case isolation output contact-to-output contact | −16.0 dB |

A comparison of Tables 1 and 2 demonstrates an interface device that includes a resistor-less power splitter (e.g., interface device 700) delivers a higher (−12.7 dB versus −16.9 dB) power transmission to any output contact than an interface device that includes a resistor-based power splitter (e.g., interface device 500). But, the interface device that includes the resistor-less power splitter performs worse than the interface device that includes the resistor-based power splitter in terms of impedance matching and output contact-to-output contact isolation. Yet, the interface device that includes the resistor-less power splitter may still outperform conventional device drivers in that it does provide a phase-matched interface and some output contact-to-output contact isolation. However, the interface device that includes the resistor-less power splitter may perform worse than the interface device that includes the resistor-based power splitter overall. For example, reflections resulting from mismatches between transmission lines and optoelectronic devices may couple to other optoelectronic devices in an optoelectronic array device. An advantage over the interface device that includes the resistor-based power splitter is that the interface device that includes the resistor-less power splitter may be easier to fabricate, since it does not involve integrated resistor fabrication.

Figure 9:
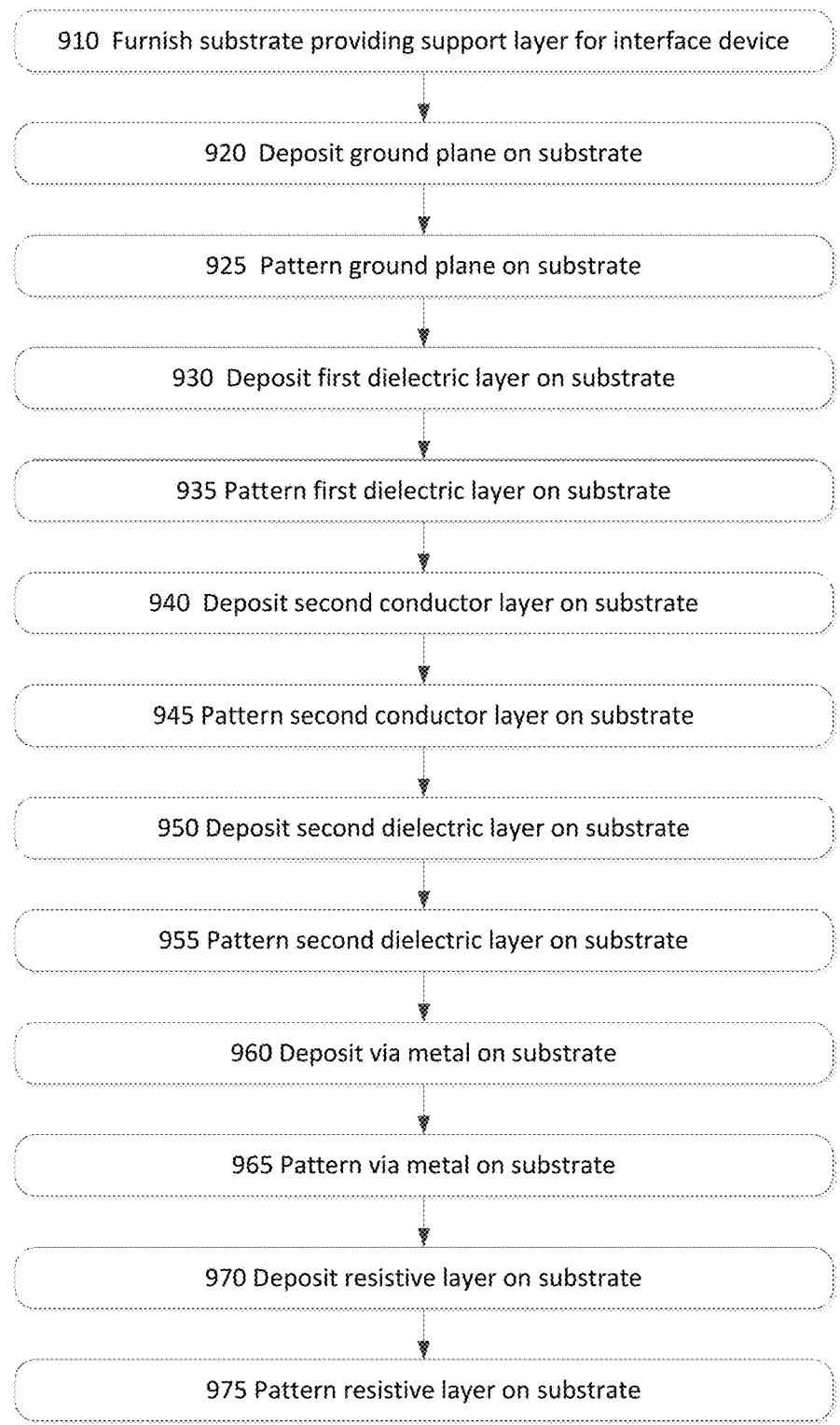
FIG. 9 is a flowchart illustrating an embodiment of a method for manufacturing an interface device that provides an impedance-matched and/or a phase-matched interface between an optoelectronic device array and a driver device.

FIG. 9 is a flowchart illustrating an embodiment of a method 900 for manufacturing an interface device that provides an impedance-matched and/or a phase-matched interface between an optoelectronic device array and a driver device. In an embodiment, the interface device is comprised of any combination of the components described above. For example, the interface device may be comprised of one or more of: an input, an output comprised of a plurality of output contacts, a power splitter comprised of a plurality of transmission lines having a common electrical length. In an embodiment, the power splitter may be further comprised of a plurality of resistors.

In block 910, a substrate is furnished that provides a support layer for the interface device. In an embodiment, the sequence of steps represented by blocks 920-970 may form a substrate stack substantially similar to substrate stack 100 of FIG. 1. The fabrication sequence may compose one or more of the optional blocks represented by blocks 920-970. In block 920 a metal or conductive layer is deposited on the substrate 910 to form a ground plane for the device. Typically, layer 920 will be patterned in block 925 by one of many processes known to those skilled in the art to remove material is some areas as needed for the final device configuration. The means of patterning layer 920 and other subsequent deposited layers may involve creating a patterned mask layer in photoresist that will be removed after the deposition leaving the metal layer in areas not covered by the resist. Similar processes may include silk screening for a metal paste deposition that will be sintered afterwards or a shadow mask to define the area of metal deposition. An alternative patterning approach, performed after the metal deposition step in 920, is to mask parts of the metal layer and etch away metal in unprotected areas by wet or dry etch processes.

In optional block 930, a first dielectric layer is deposited on the substrate including the ground plane. In optional block 935, the dielectric layer is patterned by one of several processes as described for block 925 earlier. This pattern process may include openings in the dielectric layer to the surface of the ground plane layer of block 920. In optional block 940, a conductor layer for forming a plurality of transmission lines is deposited on the substrate. The conductor layer may then be patterned and etched to form transmission lines and bonding pads by the block 945 process. In an embodiment, where the ground plane layer of block 920 is exposed by the patterning of block 935 of the dielectric layer of block 930, one or more conductive vias (e.g., conductive via 170 of FIG. 1) are fabricated within the first dielectric layer by the conductive layer deposited in block 940 to electrically couple the ground plane to features formed in a conductor layer for anode and cathode contacts.

In optional block 950, a second dielectric layer is deposited on the substrate. The second dielectric layer may then be patterned and etched in block 955 to allow the optoelectronic devices to make contact to the conductive layer and for the resistors formed in the resistive layer to make contact to the conductive layer. In optional block 960, an additional conductive layer is deposited on the patterned dielectric layer of blocks 950 and 955 to provide electrical contact for resistors formed in the resistive layer. In optional block 965, the conductive layer of block 960 is patterned so as to create electrical contacts for the resistors to be fabricated in blocks 970 and 975. In an embodiment, one or more conductive vias (e.g., conductive via 180 of FIG. 1) are fabricated within the second dielectric layer of block 950 by the patterning process of block 955 to electrically couple the conductor layer of block 960 to features formed in a resistive layer to form the resistors. In optional block 970, a resistive layer for forming a plurality of resistors is deposited on the substrate. The resistive layer may then be patterned and etched by processes of block 975 to form discrete resistors. Where the resistor layer contacts the conductive pattern of blocks 960 and 965 contact is made to the conductive layers formed in blocks 940 through the conductive via 180 of FIG. 1. The patterning of the conductive, dielectric and resistive layers can be done by lithographic processes commonly used for fabricating hybrid circuits. Other processes, such as silk screen printing or patterned deposition may be used.

Figure 10:
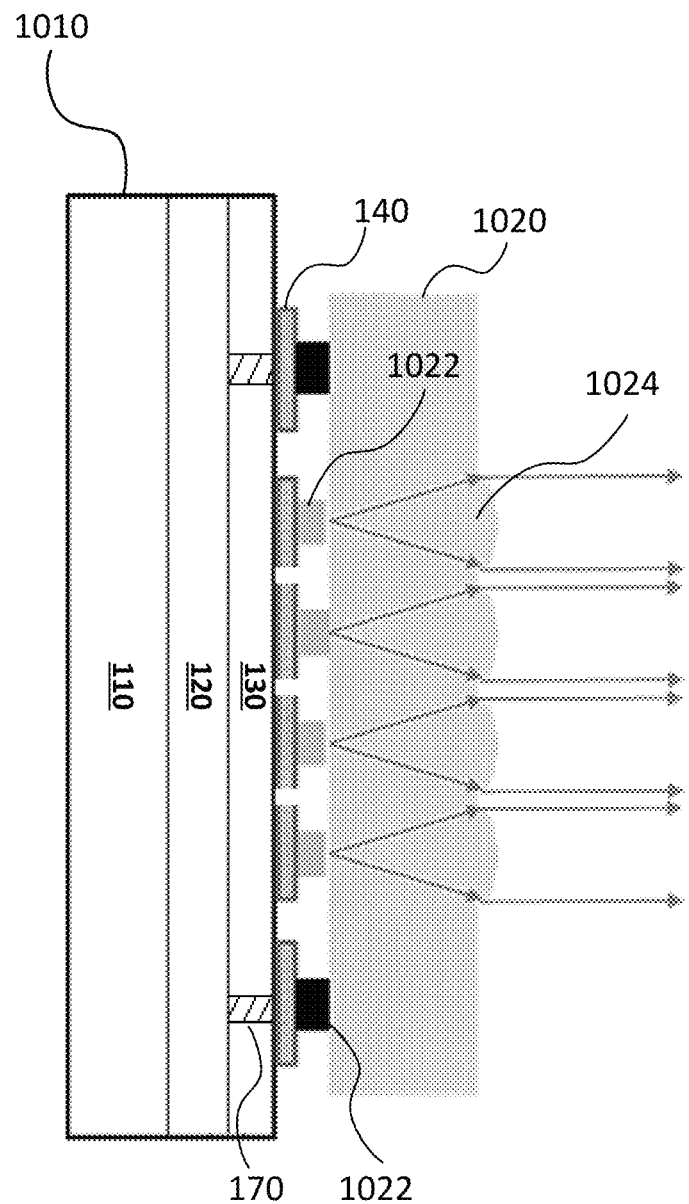
FIG. 10 is a cross-section view of an interface device with a resistor-less power splitter bonded to an optoelectronic array device, in accordance with an embodiment of the present disclosure.

FIG. 10 is a cross-section view of an interface device 1010 with resistor-less power splitters bonded to an optoelectronic array device 1020, in accordance with an embodiment of the present disclosure. In an embodiment, interface device 1010 may be substantially similar to interface device 800 of FIG. 8. In an embodiment, the resistor-less power splitters may be implemented as resistor-less power splitters 740-752 of FIG. 8. Interface device 1010 may be formed of many possible materials, including silicon, ceramic, printed circuit boards, and flat-flex cables. For example, interface device 1010 may be formed with substrate 110, ground plane 120, first dielectric layer 130, and conductor layer 140 of FIG. 1.

In order to uniformly drive an array of optoelectronic devices 1022, embodiments described herein may use interface device 1010 to make electrical contact to the array of optoelectronic devices through flip-chip bonding. This is illustrated in FIG. 10, which depicts optoelectronic array device 1020 flip-chip bonded to interface device 1010. The flip-chip bonding process may be accomplished by a machine that aligns the two substrates (i.e., optoelectronic array device 1020 and interface device 1010) together, then places them in contact with each other and heats one or both substrates either before or after contacting the substrates. For example, one substrate may be heated to about 285° C. and held at that temperature for about 10 min. A 20 gram weight may then be used to apply a downward pressure. The bonded wafers may then be allowed to cool to room temperature, finishing their processing. The use of flip-chip bonding technology for high speed VCSEL arrays is described in U.S. patent application Ser. No. 12/707,657, which is incorporated herein by reference in its entirety.

Optoelectronic array device 1020 may include a plurality of individual optoelectronic devices 1022 and an array of microlenses 1024. Each of the plurality of optoelectronic devices 1022 may be contacted with a solder ball or other conductive bond to provide optoelectronic array device 1020 with mechanical support, electrical contact, thermal conduction, or a combination thereof. The solder ball (or other conductive bond) may enable electrical coupling between the optoelectronic devices 1022 and impedance matching transmission lines (not shown) positioned under optoelectronic array device 1020. In an embodiment, electrical contacts may be provided at the end of the impedance matching transmission lines provided by interface device 1010 to facilitate this electrical coupling. In an embodiment, the electrical contacts may be formed using a conductor layer (e.g., conductor layer 140 of FIG. 1). In an embodiment, the electrical contacts may be a cathode sub-mount metal, an anode sub-mount metal, or a combination thereof. In an embodiment, the impedance matching transmission lines provide for transmission of high data rate optical signals to optoelectronic array device 1020.

As illustrated, the plurality of optoelectronic devices 1022 may be located on a bottom surface of optoelectronic array device 1020 and project their light through the thickness of the substrate of the optoelectronic array device 1020 and through an array of microlenses 1024. Individual microlenses 1024 of the array are illustrated by the individual bumps on a top surface of optoelectronic array device 1020 opposing the optoelectronic devices 1022. Optical emissions by the plurality of optoelectronic devices may be directed through the substrate of optoelectronic array device 1020 and through the array of microlenses 1024 to form a combined array output beam. In an embodiment, the substrate of optoelectronic array device 1020 may include openings or windows that allow the optical emissions to emit through the substrate. Although bottom emitting optoelectronic devices are described herein, both top emitting optoelectronic devices and bottom emitting optoelectronic devices can be used in embodiments.

Figure 11:
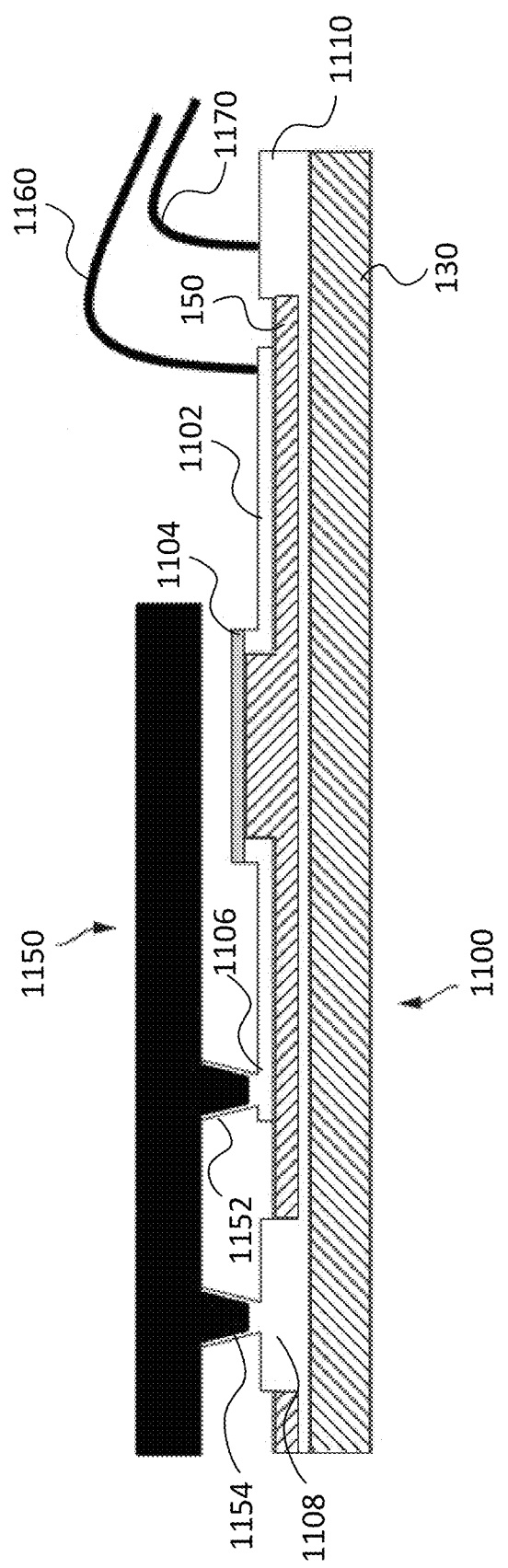
FIG. 11 is a cross-section view of an interface device with a resistor-based power splitter bonded to an optoelectronic array device designed for connection by wire bonds, in accordance with an embodiment of the present disclosure.
Figure 12:
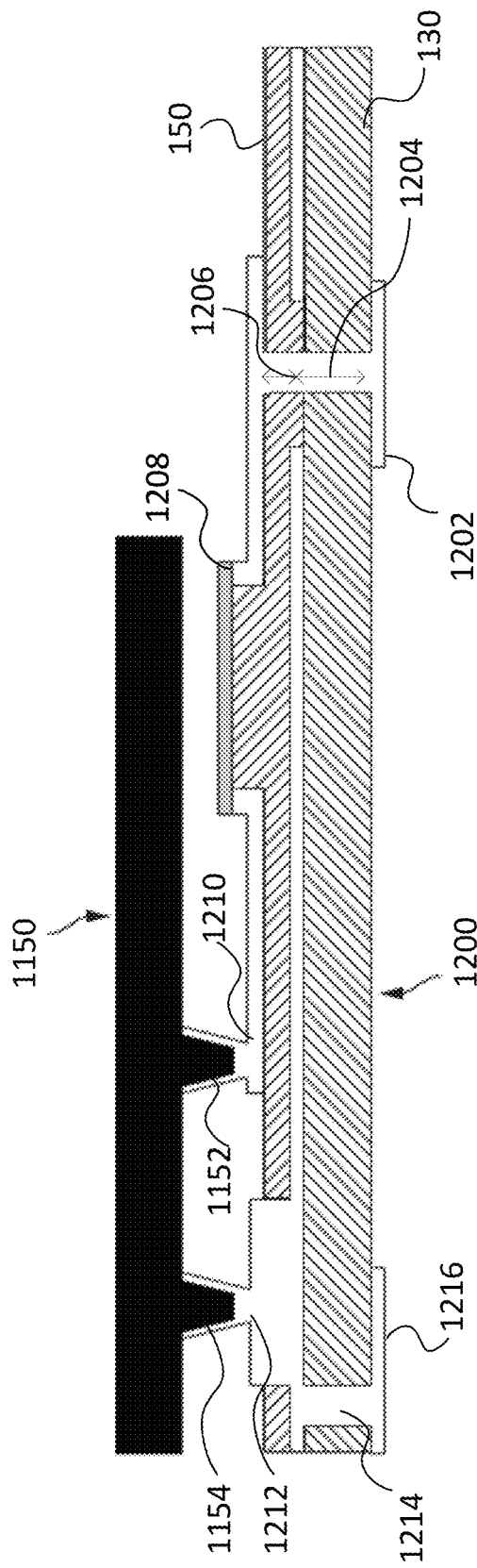
FIG. 12 is a cross-section view of an interface device with a resistor-based power splitter bonded to an optoelectronic array device designed for surface mounting with connections through substrate vias, in accordance with an embodiment of the present disclosure.

FIGS. 11-12 depict embodiments of interface devices (1100 and 1200, respectively) with resistor-based power splitters bonded to an optoelectronic array device 1150. In an embodiment, interface devices 1100 and 1200 may be substantially similar to interface device 600 of FIG. 6. Interface devices 1100 and 1200 may be formed of many possible materials, including silicon, ceramic, printed circuit boards, and flat-flex cables. For example, interface devices 1100 and 1200 may be formed with substrate 110, ground plane 120, first dielectric layer 130, conductor layer 140, second dielectric layer 150, and restive layer 160 of FIG. 1. Resistive elements in interface devices 1100 and 1200 may be formed from a resistive layer (e.g., resistive layer 160 of FIG. 1). Such resistive elements may be used to implement one or more resistor-based power splitters (e.g., resistor-based power splitters 640-652 of FIG. 6) in interface devices 1100 and 1200.

More specifically, FIG. 11 depicts a cross-section view of an interface device 1100 receiving bias current at an input contact 1102 electrically coupled to a device driver (not depicted) through external conductors 1160 and 1170. For example, external conductors 1160 and 1170 may be wires associated with an electronic package with connections to the driver device that are bonded to input contact 1102 and output contact 1110 of interface device 1100. In the embodiment depicted by FIG. 11, the bias current flows from input contact 1102 to resistive element 1104. In an embodiment, input contact 1102 is substantially similar to input 610 of FIG. 6. From resistive element 1104, the bias current flows to anode contact 1106 that electrically couples interface device 1100 to anode 1152 of optoelectronic array device 1150. In an embodiment, anode contact 1106 is a feature patterned in a conductor layer (e.g., conductor layer 140 of FIG. 1). As such, an input current path is formed in the embodiment depicted by FIG. 11 from input contact 1102 to anode contact 1106.

In the embodiment depicted by FIG. 11, a return current path begins at cathode contact 1108 where return current is received from cathode 1154 of optoelectronic array device 1150. In an embodiment, cathode contact 1108 is a feature patterned in a conductor layer (e.g., conductor layer 120 of FIG. 1, and 605 of FIG. 6 and FIG. 8). The return current flows from cathode contact 1108 to output contact 1110 via a conductor layer. In an embodiment, the conductor layer is substantially similar to conductor layer 120 of FIG. 1. From output contact 1110 the return current flows to the driver device (not depicted) via external conductor 1170. As such, the return current path is formed in the embodiment depicted by FIG. 11 from cathode contact 1108 to output contact 1110.

FIG. 12 depicts a cross-section view of an interface device 1200 receiving bias current at an input contact 1202 from a solder pad on a printed circuit board connected to the device driver (not depicted) that is routed to optoelectronic array device 1150 using conductive vias. In an embodiment, input contact 1202 is substantially similar to input 610 of FIG. 6. In the embodiment depicted by FIG. 12, the bias current flows from input contact 1202 to resistive element 1208 through conductive vias 1204 and 1206. In an embodiment, conductive vias 1204 and 1206 may be implemented by creating conductive vias in the substrate (layer 110 of FIG. 1) by processes similar to those used for form conductive vias 170 and 180 in FIG. 1. From resistive element 1208, the bias current flows to anode contact 1210 that electrically couples interface device 1200 to anode 1152 of optoelectronic array device 1150. In an embodiment, anode contact 1210 is a feature patterned in a conductor layer (e.g., conductor layer 140 of FIG. 1). As such, an input current path is formed in the embodiment depicted by FIG. 12 from input contact 1202 to anode contact 1210.

In the embodiment depicted by FIG. 12, a return current path begins at cathode contact 1212 where return current is received from cathode 1154 of optoelectronic array device 1150. In an embodiment, cathode contact 1212 is a feature patterned in a conductor layer (e.g., ground conductor layer 120 of FIGS. 1 and 605 in FIG. 6 and FIG. 8). The return current flows from cathode contact 1212 to output contact 1216 through conductive via 1214. In an embodiment, conductive via 1214 may be implemented by creating conductive vias in the substrate (layer 110 of FIG. 1) by processes similar to those used for form conductive vias 170 and 180 in FIG. 1. From output contact 1216 the return current flows to the driver device (not depicted). As such, the return current path is formed in the embodiment depicted by FIG. 11 from cathode contact 1210 to output contact 1216.

Figure 13:
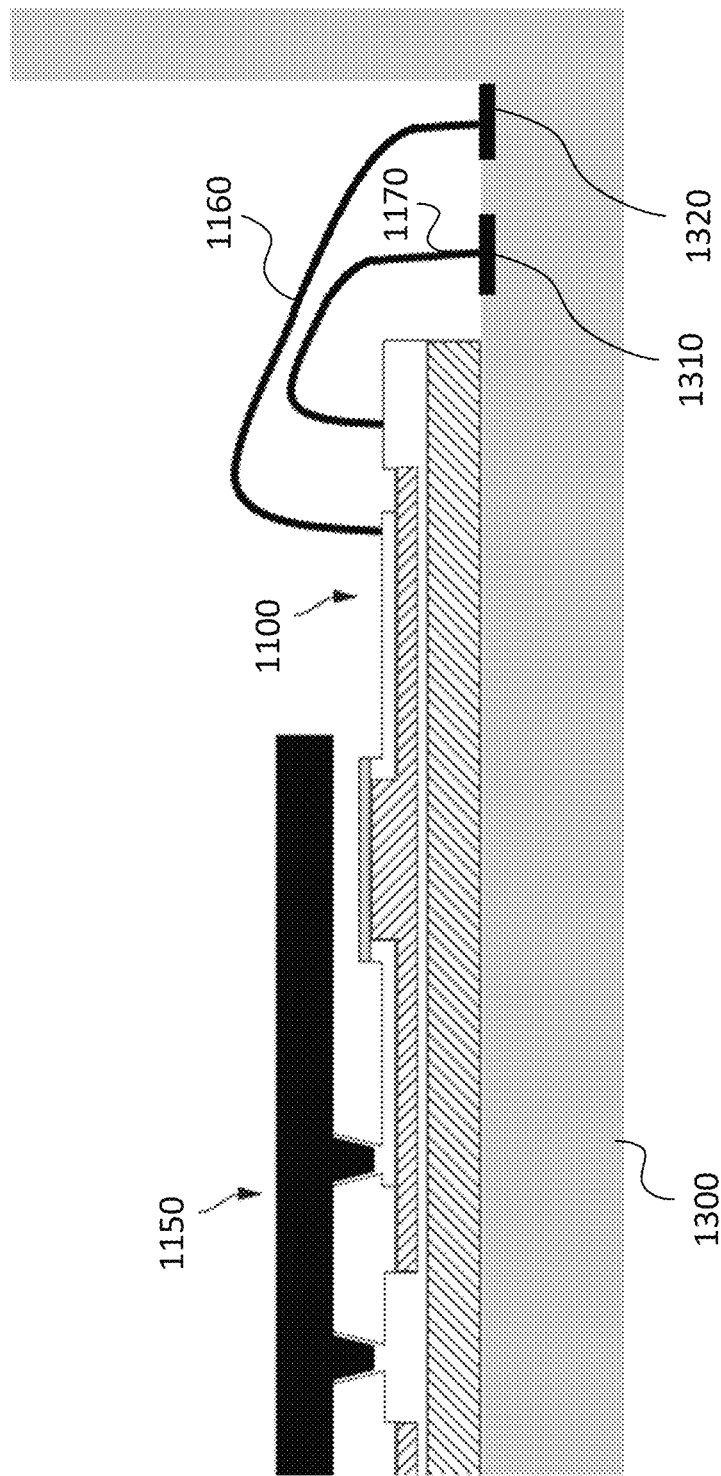
FIG. 13 depicts wirebonding the example interface device and optoelectronic array device of FIG. 11 to contacts within a hollow-body electronic package, in accordance with an embodiment of the present disclosure

FIG. 13 illustrates wire bonding the example interface device and optoelectronic array device of FIG. 11 to contacts 1310 and 1320 within a hollow-body electronic package 1300. As discussed above with respect to FIG. 11, external conductors 1160 and 1170 may be wires associated with an electronic package 1300 having connections to a driver device. By bonding external conductors 1160 and 1170 to input contact 1102 and output contact 1110 of interface device 1100, a system is formed as depicted in FIG. 15.

Figure 14:
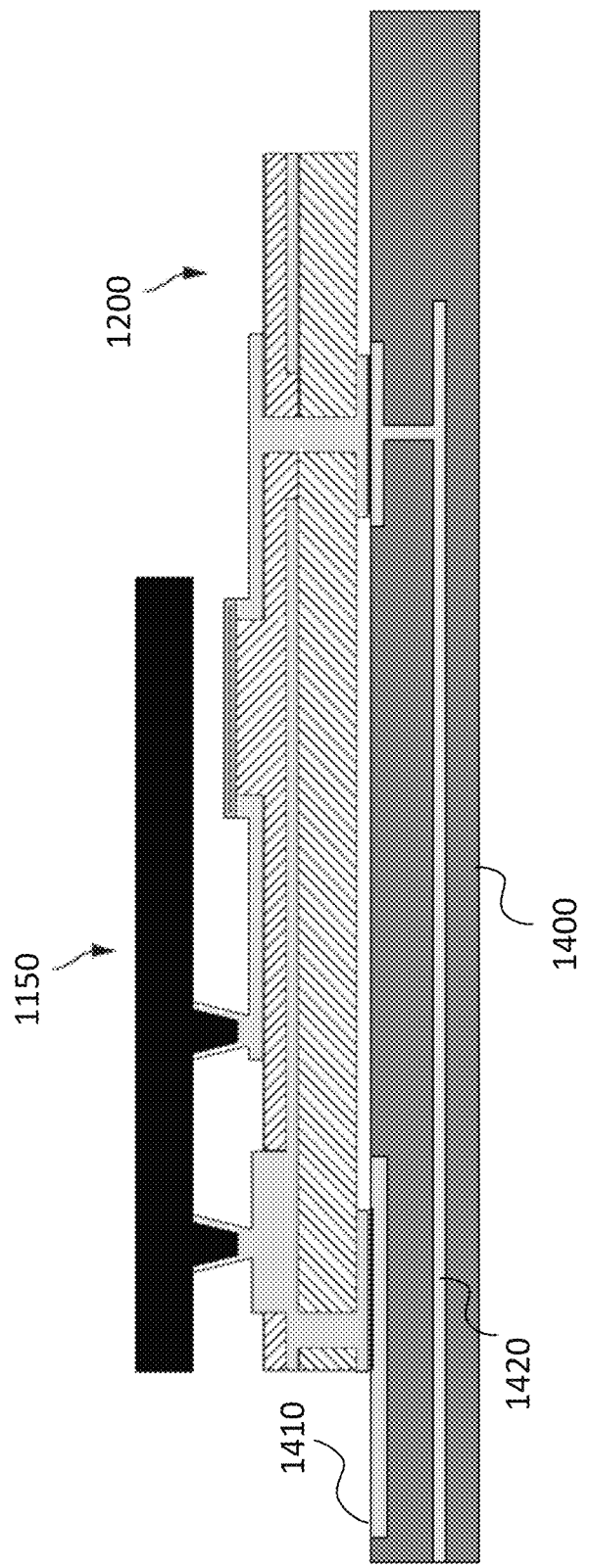
FIG. 14 depicts bonding the example interface device and optoelectronic array device of FIG. 12 to conductive pads associated with conductive traces and of a printed circuit board, in accordance with an embodiment of the present disclosure.
Figure 15:
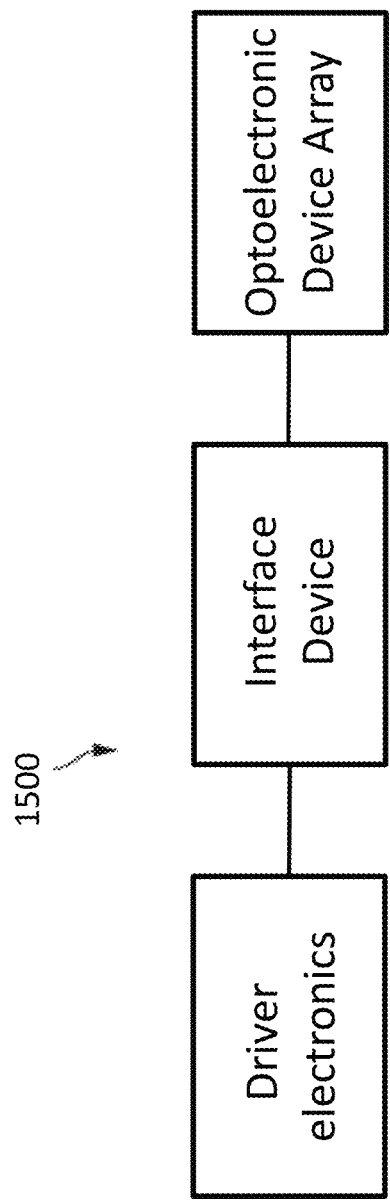
FIG. 15 depicts a block diagram of a system for providing a phase-matched and/or impedance-matched interface between a driver device and an optoelectronic array device, in accordance with an embodiment of the present disclosure.

The system 1500 depicted in FIG. 15, comprised of a driver electronics, an interface device, and optoelectronic device array, may also be formed by the example interface device and optoelectronic array device depicted in FIG. 12, and as further illustrated in FIG. 14. In FIG. 14, interface device 1200 may be bonded (e.g., soldered) like a surface mount device to conductive pads associated with conductive traces 1410 and 1420 of a printed circuit board 1400. Upon forming the system 1500 shown by FIG. 15, an interface device (e.g., interface devices 1100 and 1200) may provide a phase-matched and/or impedance-matched interface between a driver device and an optoelectronic array device 1150 thereby enabling each optoelectronic devices in the optoelectronic array device 1150 to operate coherently and at full power.

As previously noted, the various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

The present disclosure describes particular embodiments and their detailed construction and operation. The embodiments described herein are set forth by way of illustration only and not limitation. Those skilled in the art will recognize, in light of the teachings herein, that there may be a range of equivalents to the exemplary embodiments described herein. Most notably, other embodiments are possible, variations can be made to the embodiments described herein, and there may be equivalents to the components, parts, or steps that make up the described embodiments. For the sake of clarity and conciseness, certain aspects of components or steps of certain embodiments are presented without undue detail where such detail would be apparent to those skilled in the art in light of the teachings herein and/or where such detail would obfuscate an understanding of more pertinent aspects of the embodiments.

The terms and descriptions used above are set forth by way of illustration only and are not meant as limitations. Those skilled in the art will recognize that those and many other variations, enhancements and modifications of the concepts described herein are possible without departing from the underlying principles of the invention. The scope of the invention should therefore be determined only by the following claims and their equivalents.

What is claimed is:

1. An optoelectronic array device, comprising:
a plurality of optoelectronic devices;
a driver device for the plurality of optoelectronic devices;
an input adapted to interface with the driver device;
an output comprising a plurality of output contacts, each output contact among the plurality of output contacts adapted to interface with one optoelectronic device among the plurality of optoelectronic devices via one transmission line among a plurality of transmission lines having a common electrical length; and
a power splitter formed on a substrate stack electrically connecting the output to the input, wherein the input, the output and the power splitter provide a phase matched interface between the drive device and each of the plurality of optoelectronic devices among the plurality of optoelectronic devices.

2. The apparatus of claim 1, wherein the substrate stack comprises a ground plane formed on a substrate and electrically isolating the power splitter from the substrate.

3. The apparatus of claim 1, wherein the substrate stack comprises a first dielectric layer composed of a first dielectric material, the power splitter being formed on the first dielectric layer.

4. The apparatus of claim 3, wherein the first dielectric material has a dielectric loss tangent of less than 0.01 at 1 gigahertz.

5. The apparatus of claim 3, wherein each transmission line of the plurality of transmission lines has a width determined based upon a thickness of the first dielectric layer.

6. The apparatus of claim 1, wherein the substrate stack comprises a conductor layer, the plurality of transmission lines being formed in the conductor layer.

7. The apparatus of claim 1, wherein two or more output contacts among the plurality of output contacts are connected in parallel to the input.

8. The apparatus of claim 1, wherein the power splitter further comprises a plurality of resistors, each resistor of the plurality of resistors having a common resistive value.

9. The apparatus of claim 8, wherein the substrate stack comprises a resistive layer, the plurality of resistors being formed in the resistive layer.

10. The apparatus of claim 9, wherein the resistive layer is formed on a second dielectric layer above the plurality of transmission lines.

11. The apparatus of claim 8, wherein a width of each transmission line tapers from a first value to a second value in a region surrounding one resistor of the plurality of resistors based on a resistance value of the one resistor.

12. The apparatus of claim 1, wherein the power splitter is a Wilkinson power splitter.

13. The apparatus of claim 1, wherein the substrate stack is formed using thin-film deposition techniques.

14. An optoelectronic array device, comprising:
a plurality of optoelectronic devices formed on a substrate stack; and
an interface device formed on the substrate stack and providing a phase-matched interface between each of the plurality of optoelectronic devices and a driver device, the interface device comprising:
an input adapted to interface with the driver device;
an output comprising a plurality of output contacts, each output contact among the plurality of output contacts adapted to interface with one optoelectronic device among the plurality of optoelectronic devices via one transmission line among a plurality of transmission lines having a common electrical length; and
a power splitter electrically connecting the output to the input.

15. The optoelectronic array device of claim 14, wherein the substrate stack comprises:
a ground plane formed on a substrate and electrically isolating the power splitter from the substrate;
a first dielectric layer formed on the ground plane, each transmission line of the plurality of transmission lines having a width determined based upon a thickness of the first dielectric layer; and
a conductor layer formed on the first dielectric layer, the plurality of transmission lines being formed in the conductor layer.

16. The optoelectronic array device of claim 15, wherein the ground plane and the conductor layer forming the transmission lines are separately connected by bonded wires to an electronic package that can be soldered to a printed circuit board or directly to electrical contacts of the driver device.

17. The optoelectronic array device of claim 15, wherein the ground plane and the conductor layer forming the transmission lines are separately connected by conductive vias in the substrate to conductive contact pads on a lower surface of the substrate that can be soldered to a printed circuit board or directly to electrical contacts of the driver device.

18. The optoelectronic array device of claim 14, wherein the power splitter further comprises a plurality of resistors, each resistor of the plurality of resistors having a common resistive value.

19. The optoelectronic array device of claim 18, wherein a width of each transmission line tapers from a first value to a second value in a region surrounding one resistor of the plurality of resistors based on a resistance value of the one resistor.

20. A method of manufacturing an optoelectronic array device, the method comprising:
providing a substrate;
forming a substrate stack on the substrate, the substrate stack collectively comprising an interface device configured to provide a phase matched interface between each of a plurality of optoelectronic devices and a driver device, the interface device comprising:
an input adapted to interface with the driver device;
an output comprising a plurality of output contacts, each output contact among the plurality of output contacts adapted to interface with one optoelectronic device among the plurality of optoelectronic devices via one transmission line among a plurality of transmission lines having a common electrical length; and
a power splitter electrically connecting the output to the input.

21. The method of claim 20, wherein forming the substrate stack comprises:
forming a ground plane on the substrate, the ground plane electrically isolating the power splitter from the substrate;
forming a first dielectric layer on the ground plane, each transmission line of the plurality of transmission lines having a width determined based upon a thickness of the first dielectric layer; and
forming a conductor layer on the first dielectric layer, the plurality of transmission lines being formed in the conductor layer.

22. The method of claim 21, wherein the power splitter further comprises a plurality of resistors, and wherein forming the substrate stack further comprises:
    forming a second dielectric layer on the conductor layer; and
    forming a resistive layer on the second dielectric layer, the plurality of resistors being formed in the resistive layer.

\* \* \* \* \*